(12) United States Patent
Nagashima et al.

(10) Patent No.: US 7,210,304 B2
(45) Date of Patent: May 1, 2007

(54) COOLING ARRANGEMENTS FOR INTEGRATED ELECTRIC MOTOR-INVERTERS

(75) Inventors: James M. Nagashima, Cerritos, CA (US); Karl D. Conroy, Huntington Beach, CA (US); Eric R. Ostrom, Bellflower, CA (US); Gregory S. Smith, Woodland Hills, CA (US); George John, Cerritos, CA (US); David Tang, Fontana, CA (US); Terence G. Ward, Redondo Beach, CA (US)

(73) Assignee: General Motors Corporation, Detroit, MI (US)

( * ) Notice: Subject to any disclaimer, the term of this patent is extended or adjusted under 35 U.S.C. 154(b) by 263 days.

(21) Appl. No.: 11/054,483

(22) Filed: Feb. 9, 2005

(65) Prior Publication Data
US 2006/0174642 A1    Aug. 10, 2006

(51) Int. Cl.
*F23D 23/12* (2006.01)
(52) U.S. Cl. ...................... 62/259.2; 62/310
(58) Field of Classification Search ............... 62/119, 62/259.2, 310, 239, 242
See application file for complete search history.

(56) References Cited
U.S. PATENT DOCUMENTS 6,278,179 B1 * 8/2001 Mermet-Guyennet ....... 257/686
6,772,603 B2 * 8/2004 Hsu et al. ................ 62/259.2

* cited by examiner

*Primary Examiner*—Melvin Jones
(74) *Attorney, Agent, or Firm*—Christopher DeVries

(57) ABSTRACT

In order to provide a modular arrangement, an inverter for an electric traction motor used to drive an automotive vehicle is positioned in proximity with the traction motor. The inverter is located within a compartment adjacent to one end of the electric traction motor and is cooled in a closed system by spraying a liquid coolant directly onto the inverter. The liquid coolant absorbs heat from the inverter and is cooled by a heat exchange arrangement comprising a reservoir with pipes carrying a second coolant from the radiator of the automotive vehicle. In a preferred embodiment, the coolant is collected from the inverter in an annular reservoir that is integral with the compartment containing the inverter. In accordance with one embodiment of the cooling arrangement, heat from the inverter vaporizes the liquid coolant by absorbing heat from the inverter during a phase change from a liquid to a vapor. The vaporized coolant is condensed by a circulating second coolant in pipes connected to the vehicle's radiator through a condenser that is preferably coaxial with the motor and the annular reservoir, which annular reservoir in the second embodiment collects overspray liquid coolant. In order to avoid degrading the inverter, the coolant is a dielectric fluid.

22 Claims, 9 Drawing Sheets

COOLING ARRANGEMENTS FOR INTEGRATED ELECTRIC MOTOR-INVERTERS

FIELD OF THE INVENTION

The present invention is directed to cooling arrangements for integrated electric motor-inverters. More particularly, the present invention is related to cooling arrangements for integrated electric motor-inverters wherein the motor is a traction motor used to drive electric vehicles such as, but not limited to, gas-electric hybrid vehicles and fuel cell powered electric vehicles.

BACKGROUND OF THE INVENTION

Vehicles which utilize electric traction motors to drive wheels of a vehicle, whether the electric motor is in a gas-electric hybrid vehicle or a fuel cell powered vehicle typically use a three-phase AC motor coupled with an inverter that converts direct current from a power source to alternating current. The inverter circuitry generally comprises IGBTs (insulated gate bipolar transistors) mounted on a DBC (direct bonded copper) substrate. The DBC has integrated bus bars, and with a circuit card and signal connector provides a power electronics package.

As automotive vehicles start, change cruising speeds, accelerate and brake, power demands of electric traction motors driving the vehicles fluctuate over a wide range. Fluctuations in power demand cause temperature changes in the inverters connected to the traction motors. Since the inverters comprise IGBTs mounted on the DBCs with integrated bus bars, the inverters are comprised of different materials with various coefficients of expansion. Accordingly, heat fluctuations can degrade inverters as the integrated components thereof expand at different rates tending to shift slightly with respect to one another as the components respond to temperature variations. Accordingly, it is necessary to control temperature to keep expansions and contractions of the components within optimal levels. Currently, this is accomplished by circulating fluids through heat sinks associated with the DBC or by flowing air over the power electronics to absorb and carry away heat. While these approaches currently appear satisfactory, there remains a need to more precisely control the temperature of power electronics over the life of vehicles utilizing traction electric motors in order to sustain reliability of, as well as power consumption by, the vehicles.

There is a continuing effort in configuring automotive vehicles to optimize the use of space within automotive vehicles while facilitating ease of assembly and maintenance. In accomplishing optimal use of space, attempts are made to organize related components into modules, however packaging inverters with motors present a problem because inverters have different cooling requirements.

SUMMARY OF THE INVENTION

In view of the aforementioned considerations, a cooling arrangement for cooling components of an inverter circuit has the components packaged proximate an electric traction motor for driving at least one traction wheel of an automotive vehicle. The arrangement comprises a housing disposed proximate the electric traction motor, wherein the housing has a compartment with a space containing the components. The compartment has an inlet opening and an outlet opening for cooling fluid communicating with the space containing the components. The cooling fluid is a dielectric cooling fluid which is dispensed in liquid phase into the space and onto the components of the inverter circuit by a pump provided for cycling the dielectric coolant from a reservoir that collects the dielectric coolant from the components. The reservoir uses a second coolant in a liquid-fluid heat exchanger to transfer heat from the dielectric fluid before the dielectric fluid is again cycled over the components.

In a further aspect of the cooling arrangement, the reservoir is proximate the compartment containing the components, and with the pump, is an integral part of part of the housing.

In a further aspect of the cooling arrangement, the compartment is disposed at one end of the electric traction motor and extends laterally with respect thereto, while the reservoir is disposed in the housing, which housing extends around the traction motor and coaxially with respect to the traction motor.

In a further aspect of the cooling arrangement, the cooling arrangement further includes a control for monitoring the cooling requirements of the components, the control being connected to the pump to power the pump in accordance with the cooling requirements.

In a further aspect of the cooling arrangement, the cooling arrangement is in combination with a cooling system for a fuel cell stack or a gas-powered traction engine, the cooling system having the second coolant circulating through a radiator.

In a further aspect of the cooling arrangement, the components comprise an insulated gate bipolar transistor arrangement.

In a further aspect of the cooling arrangement, the dielectric coolant is a mixture of polypropylene glycol methyl ether and hexamethyldisiloxane.

In still a further aspect of the cooling arrangement, the dielectric coolant has a phase change point selected to absorb a substantial quantity of heat at the boiling temperature of the coolant before the coolant evaporates.

In still a further aspect of the cooling arrangement, a condenser converts vaporized coolant to liquid coolant before recycling the coolant onto the components.

In still a further aspect of the cooling arrangement, the condenser is coaxial with the reservoir and the electric motor.

BRIEF DESCRIPTION OF THE DRAWINGS

Various other features and attendant advantages of the present invention will be more fully appreciated as the same becomes better understood when considered in conjunction with the accompanying drawings, in which like reference characters designate the same or similar parts throughout the several views, and wherein.

DETAILED DESCRIPTION

Figure 1:
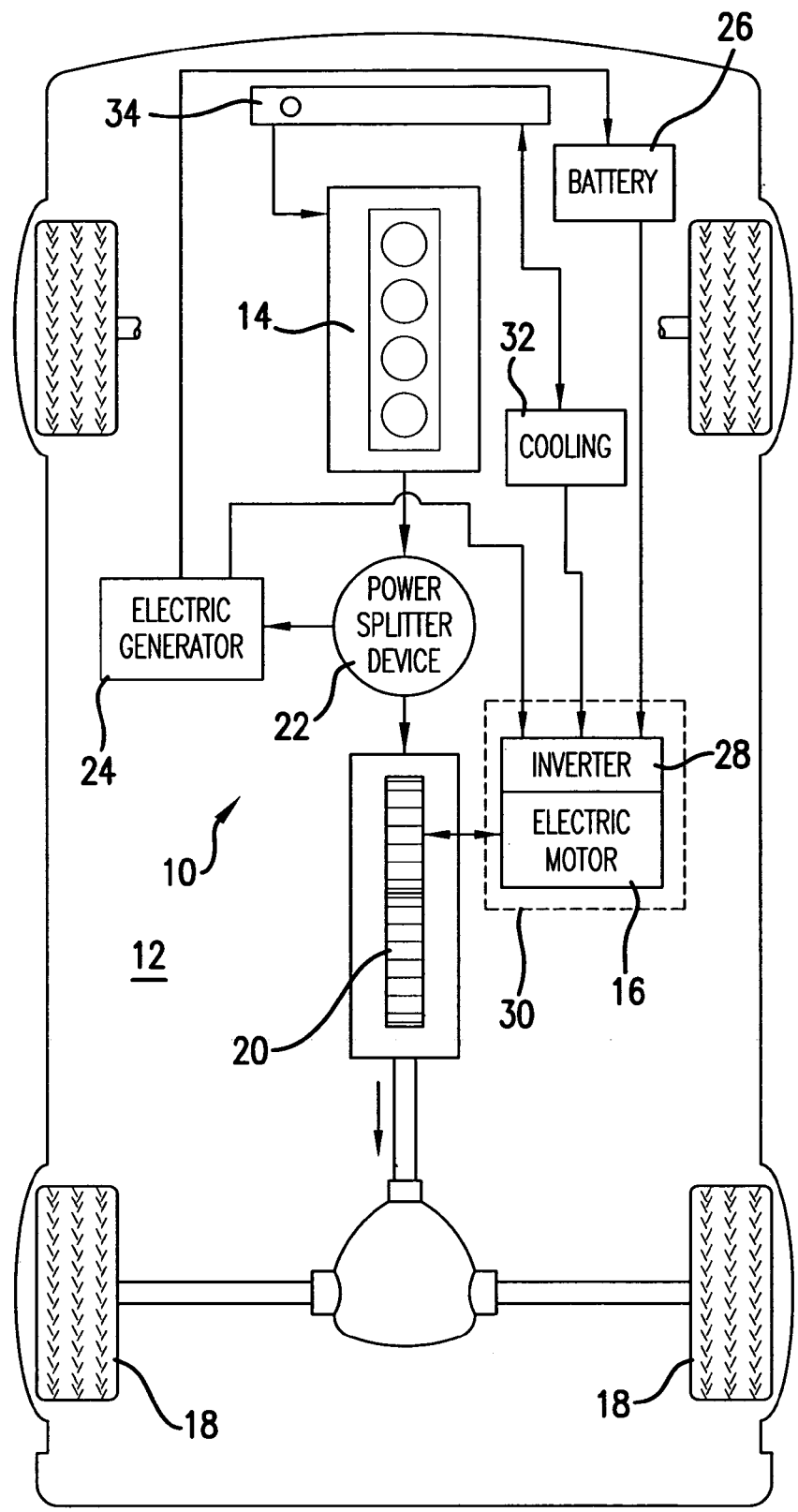
FIG. 1 is a schematic view of an automotive vehicle having a gas-electric hybrid drive.

Referring now to FIG. 1, there is shown an example of a gas-electric drive 10 for powering a vehicle 12 utilizing an internal combustion engine 14 and an electric traction motor 16 to drive, through a transmission 20, wheels 18 of the vehicle. A power splitter 22 determines whether the internal combustion engine 14 or the electric motor 16 drives the transmission 20, or whether the transmission 20 or internal combustion engine drives an electric generator 24. In another embodiment, the generator 24 is mounted next to the electric traction motor 16 and cooled with the same arrangement as the traction motor. The electric generator 24 charges a battery 26 and/or provides current to an inverter 28 that delivers current to the electric traction motor 16. In accordance with the present invention, the electric traction motor 16 and inverter 28 are configured as a modular unit 30. This provides an opportunity for a reduction in the space consumed by the electric traction motor 16 and inverter 28. Since the inverter 28 generates heat, the inverter requires a cooling arrangement 32. In accordance with one aspect of the present invention, the cooling arrangement 32 has a sealed cooling circuit which is coupled thermally to a radiator 34 which cools the internal combustion engine 14. The cooling arrangement 32 may be remote from the module 30, as shown in FIG. 1, or integral therewith as shown in FIG. 2.

Figure 2:
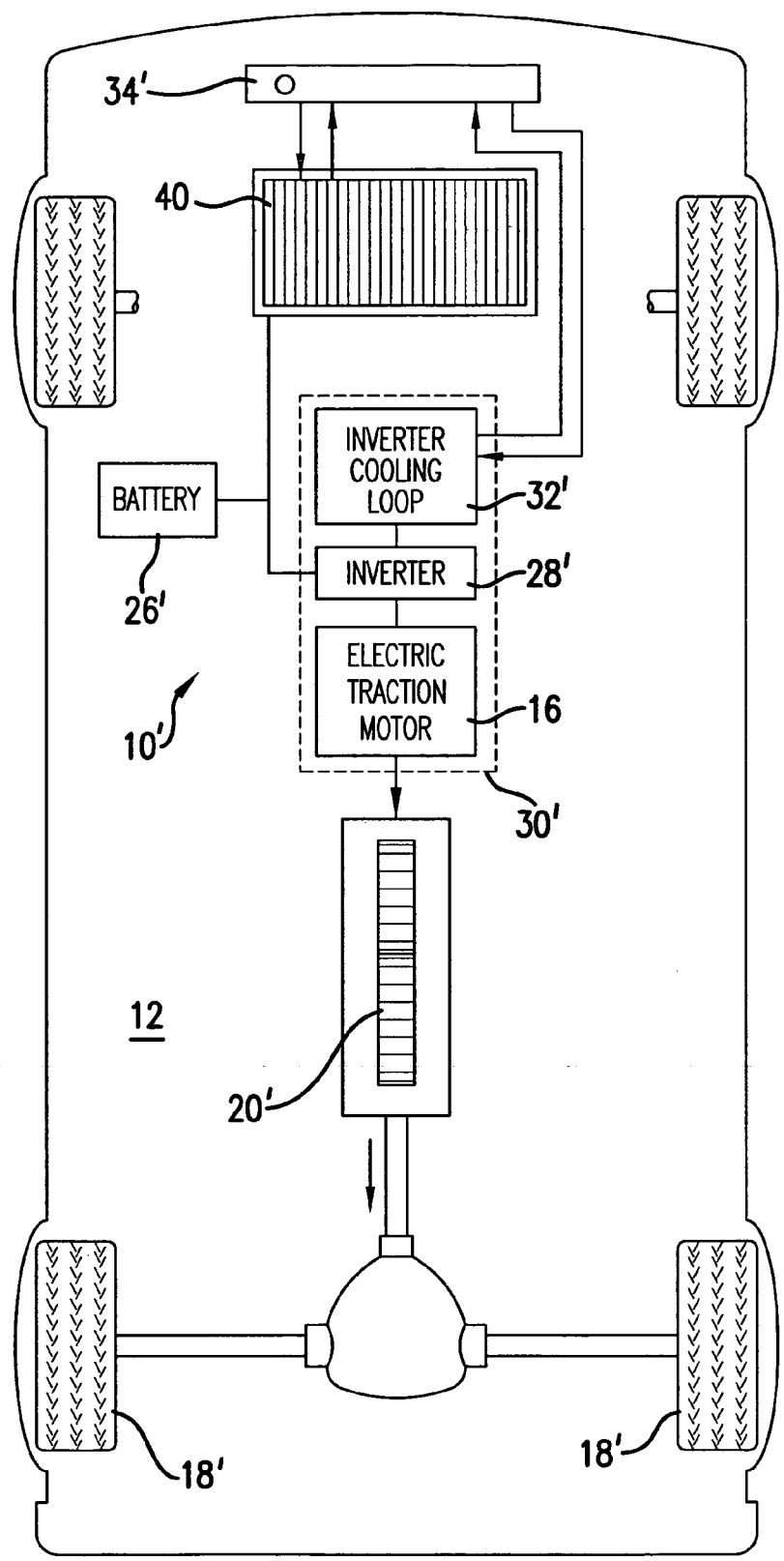
FIG. 2 is a schematic view of an automotive vehicle that uses fuel cell power to drive an electric traction motor.

Referring now to FIG. 2, a fuel cell drive system 10' utilizes a fuel cell 40 to power an electric traction motor 16 which drives the wheels 18 through a transmission 20'. The fuel cell 40 is connected either directly or through a battery pack 26' to inverter 28' for the motor 16. As with the gas-electric hybrid of FIG. 1, the inverter 28' is integral with the motor 16 to provide a power module 30'. Moreover, as with the gas-electric hybrid of FIG. 1, the inverter 28' has a cooling arrangement 32' that is coupled thermally to a radiator 34' used to cool the fuel cell 40. The motor 16 and inverter 28' are associated in a module 30', which module 30' includes the cooling arrangement 32' integral therewith. Alternatively, the cooling arrangement 32' can be remote from the module 30', as is shown by the cooling arrangement 32 of FIG. 1.

Figure 3:
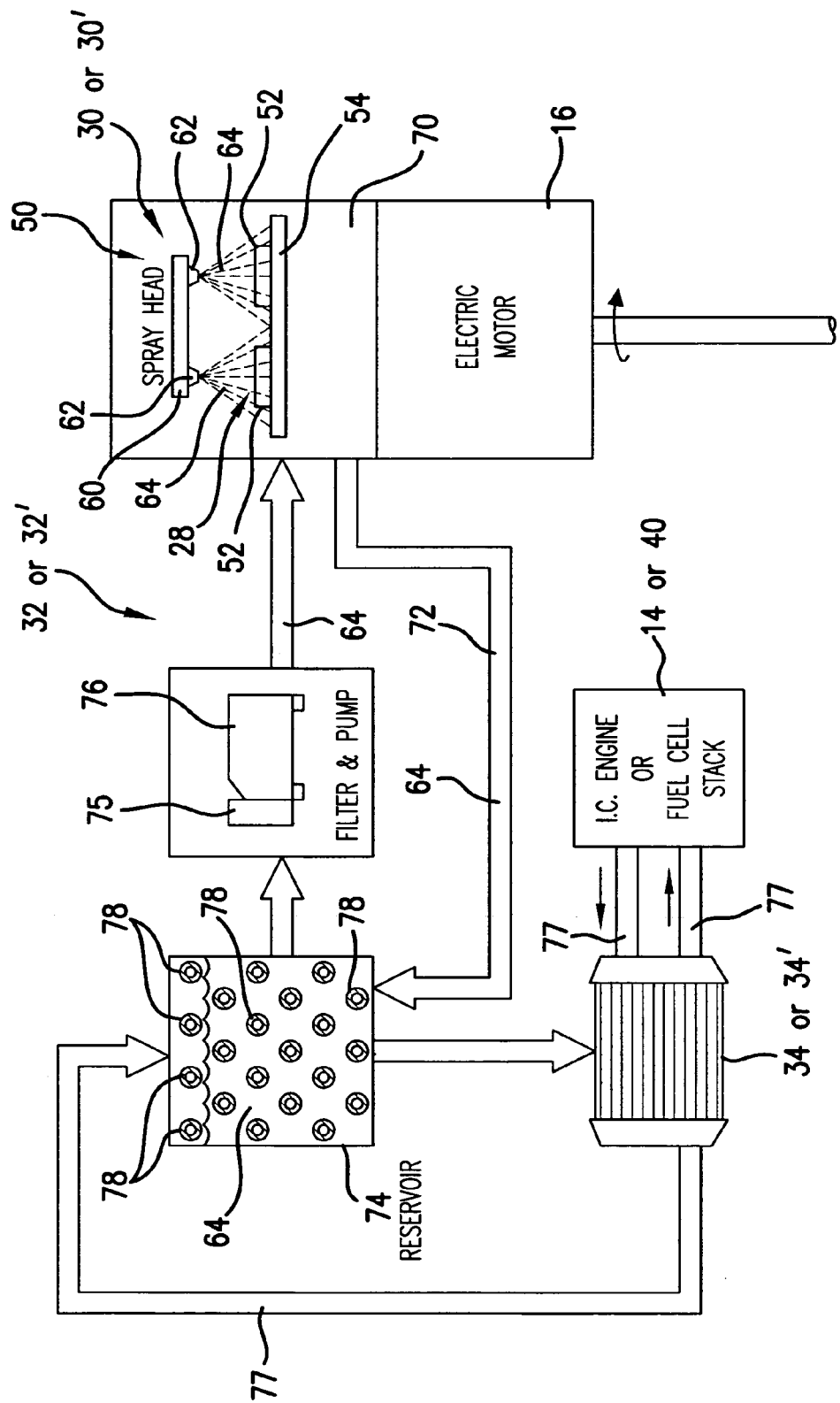
FIG. 3 is a schematic view of a first embodiment of a cooling system for cooling inverter components coupled to the electric traction motors of FIG. 1 or 2.

Referring now to FIG. 3, a first embodiment of the cooling system 32 or 32' shown in FIGS. 1 and 2, respectively, is usable with either the gas-electric hybrid drive 10 or the fuel cell drive 10'. The gas-electric hybrid drive 10 and the fuel cell drive 10' are merely exemplarily of various configurations for such drives. For example, the gas-electric hybrid drive 10 can be configured as a parallel arrangement, a series arrangement or any other effective arrangement, as can the fuel cell drive 10'. The gas-electric hybrid drive 10 may use a gasoline engine, a diesel engine, a turbine engine or any other engine configuration.

The inverter 28 is positioned within a compartment 50 which is disposed adjacent to the electric motor 16. The inverter 28 includes insulated gate bipolar transistors (IGBTs) 52 which are bonded with a direct bonded copper (DBC) substrate 54 that is integrated with an AC/DC bus to form an inverter circuit. The IGBT 52 is cooled by a coolant dispenser 60 which has spray nozzles 62 that dispense coolant 64 in liquid form directly on the IGBTs 52 and the associated DBC 54 and bus. While the illustrated embodiment sprays the coolant 64 as liquid droplets, in other embodiments the coolant is dispensed in stream form or flooded over the inverter 28. In still another embodiment, the inverter 28 is immersed in the liquid coolant 64, but preferably the liquid coolant 64 is sprayed as a mist or in discreet droplets onto the inverter 28.

By using the coolant dispenser 60, coolant liquid 64 is applied directly to the source of heat of the IGBT 52, which allows the power density (power per unit volume) of the motor inverter 28 to be increased. To be cooled by the liquid coolant 64, heat generated by the IGBT 52 need not travel through multiple layers of materials, a few of which have low thermal conductivity. Rather, a direct thermal path provided by spray cooling reduces the temperature of the IGBT 52. With lower temperature for the IGBT 52, increased power is available through the inverter 28 to the traction motor 16. Alternatively, with improved cooling a smaller inverter 28 may be provided to produce the same power level for the traction motor 16.

The spray cooling provided by the spray nozzles 62 is also usable on other components associated with the inverter 28, such as capacitors, transformers, integrated circuits and bus bars that are temperature sensitive. The spray cooling provides cooling to wire bonds between the elements of the IGBT 52 and prevents wire bonds from overheating, consequently helping to minimize failure. Accordingly, along with the resulting reduction of component temperatures, improved reliability is provided.

Because spray cooling provides increased cooling capacity, spray cooling improves resistance of the inverter 28 to transient power fluctuations. Transient power fluctuations exist on the input to the power inverter 28 due to sudden increases in power demanded by the vehicle 12 for short periods of time. The fluctuations can be caused by increased resistance to the output of the motor 16 which in turn cause temperature increases in the IGBT 52. By having direct application of the cooling media 64 to the IGBT 52, temperature change is reduced in both time duration and temperature increase.

In order that the coolant 64 not electrically interact with or degrade the components of the inverter 28, the coolant is a dielectric coolant. A suggested coolant is a mixture of methylsiloxane and an organic compound such as polypropylene glycol methyl ether, wherein the coolant has minimal instability and reactivity. An example of such a liquid is OS-120 available from Dow Corning Corporation, which is a mixture of hexmethyldisiloxane and propylene glycol methyl ether, the hexmethyidisiloxane having a percentage by weight greater than 60% and the propyleneglycol methyl ether having a percentage by weight in a range of 10% to 30%. Other dielectric coolants which have minimal instability and reactivity with the electrical components of the inverter may be used as alternatives to OS-120.

Referring again to FIG. 3, the coolant 64 is sprayed as a liquid and is collected in a sump portion 70 of the compartment 50 and through a spray return 72 to a reservoir 74 which is connected through a filter 75 to a pump 76. The pump 76 is connected to the dispenser 60 that supplies recycled liquid coolant to the spray nozzles 62 for continued cooling of the inverter 28. While the coolant 64 is circulating through the reservoir 74, it is cooled by a second liquid coolant 77, such as a water ethylene glycol solution, which flows through tubes 78 in the reservoir 74. The second liquid coolant 77 is supplied by the radiator 34, which cools the internal combustion engine 14 of FIG. 1 or is supplied by the radiator 34', which cools the fuel cell stack 40 of FIG. 2. The pump 76 is preferably a variable speed pump which is controlled by the output of the IGBTs 52. As the output of the IGBTs 52 increases, the speed of the pump 76 increases which increases the amount of liquid coolant 64 sprayed through spray nozzles 62. Alternatively, the temperature of the IGBT 52 may be monitored with a thermocouple arrangement with the speed of the pump 76 being increased as the temperature of the IGBT increases to spray more liquid coolant and thereby decrease the temperature of the IGBT.

Figure 4:
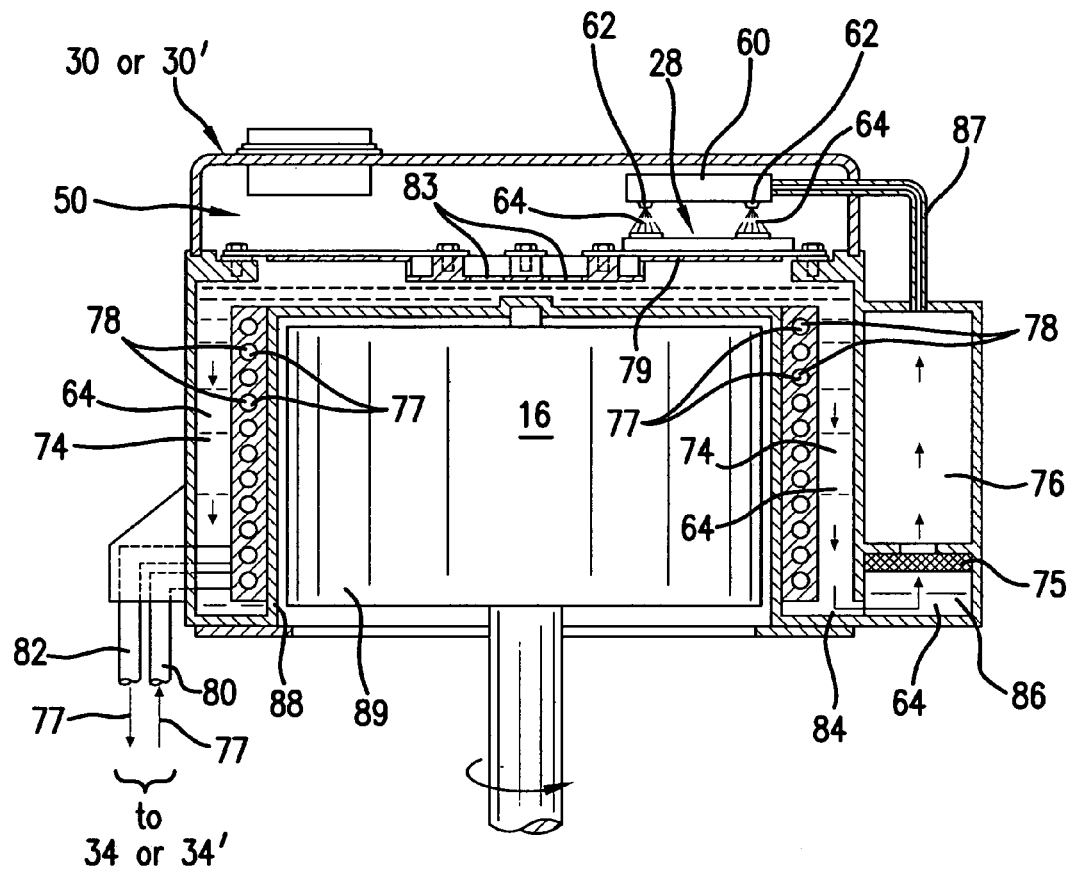
FIG. 4 is an elevation of a spray cooled, integrated motor-inverter, configured to employ the cooling arrangement of FIG. 3.

Referring now to FIG. 4, there is shown a preferred arrangement for the spray cooled coolant loop 30 or 30', wherein the spray cooled coolant loop of FIG. 3 is integral with the compartment 50 containing the inverter 28 supported on a base 79. In FIG. 4, the reservoir 74 and cooling coils 78 are disposed in a reservoir portion 74 that surrounds the motor 16 and extends coaxially with respect to the motor. The reservoir 74 is substantially annular in shape and includes the cooling channels or cooling channel 78 connected by an inlet 80 and an outlet 82 to a vehicle radiator such as one of the vehicle radiators 34 or 34' of FIGS. 1 and 2, respectively. The reservoir 74 is filled by heated liquid coolant 64 flowing from the inverter 28 through an opening, such as the opening 83 in the support 79 for the inverter, and is connected by a return 84 to a sump 86 that is connected to the coolant pump 76 through the filter 75. The coolant pump 76 is connected by line 87 to the dispenser 60 and spray nozzles 62. The spray nozzles 62 preferably dispense the coolant 64 in liquid phase as droplets or a mist onto the inverter 28. Heat is then transferred from the inverter 28 to the liquid coolant 64. The liquid coolant 64 then drains into and cools in the reservoir 74, where heat is removed therefrom by the second coolant 77 circulating through the channels or channel 78 over or past which the heated liquid coolant 64 flows. Preferably, the pipe channels are next to an inner wall 88 of the reservoir 74 so that the second cooling fluid 77 rejects heat from the stator 89 of the motor 16. The pump 76 recycles the liquid coolant 64 in accordance with the power demands of the inverter 28.

Figure 5:
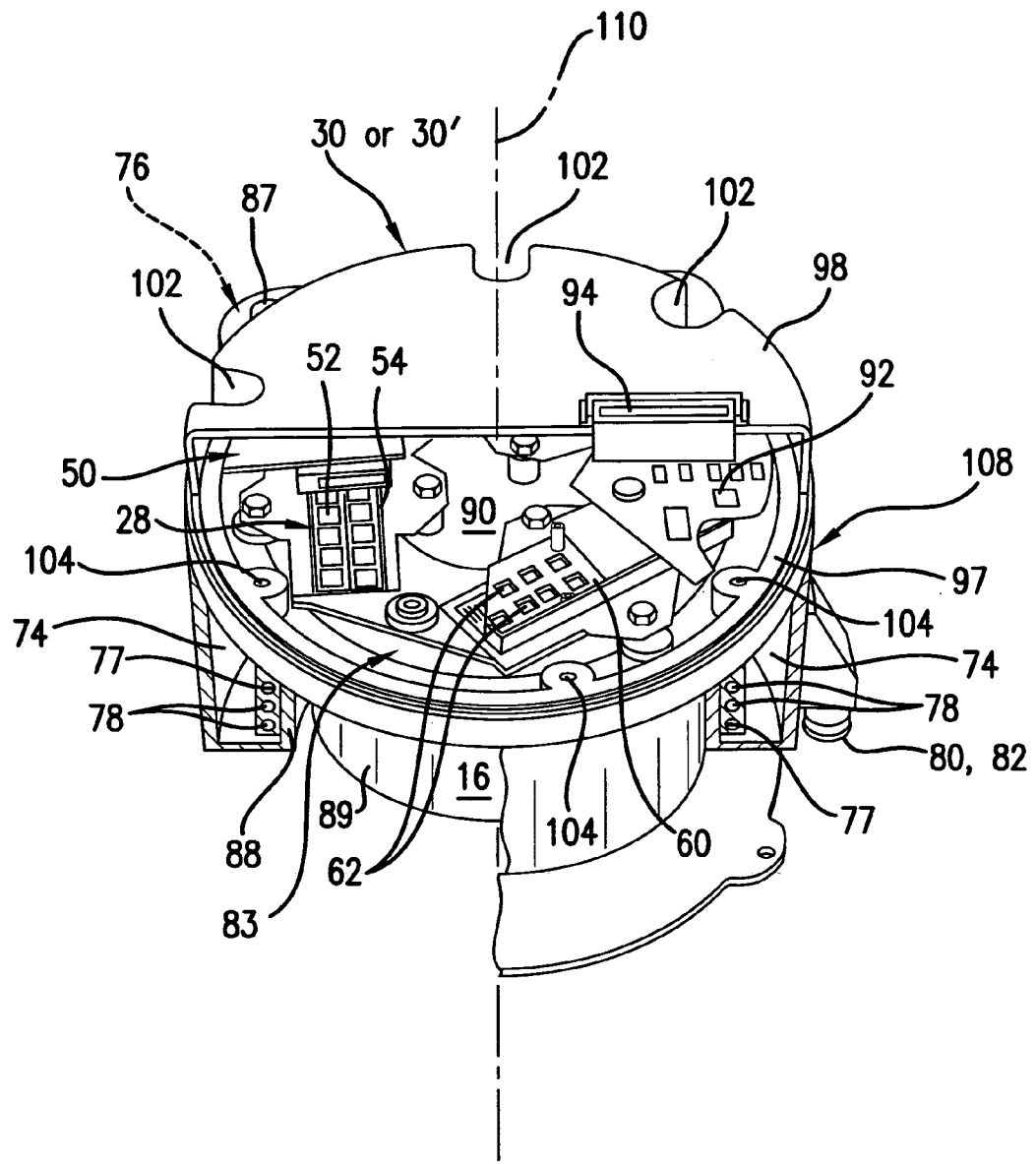
FIG. 5 is a perspective view, partially in section, of a spray cooled, integrated motor-inverter configured similar to that of FIG. 4.
Figure 6:
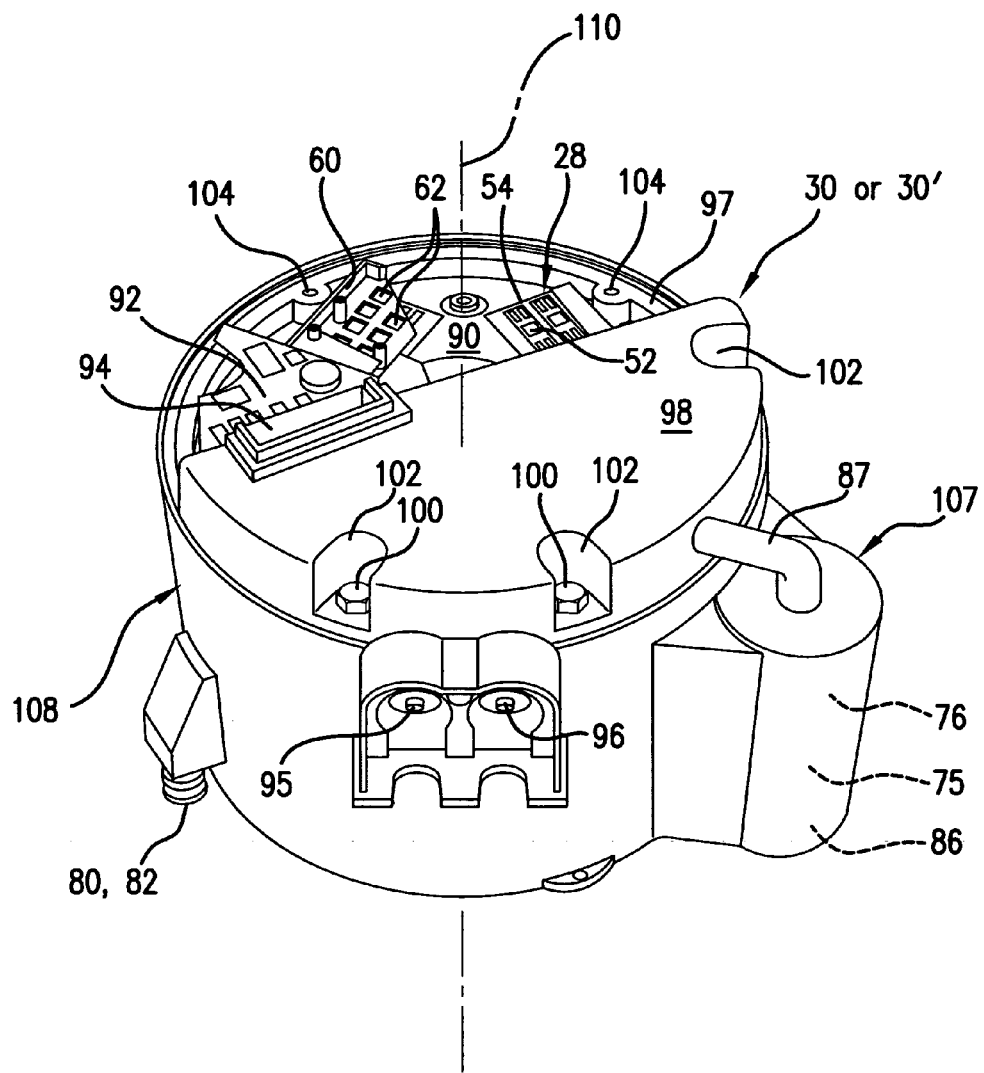
FIG. 6 is a perspective view, partially in section, of the spray cooled integrated-motor inverter of FIG. 5, but shown from the opposite sides.

FIGS. 5 and 6 show the module 30 or 30' of FIG. 4 as it might appear in an installed embodiment where it is seen that the compartment 50 has a base 90 therein which supports the coolant dispenser 60 having the spray nozzles 62 that dispense liquid coolant 64. Also supported on the base 90 is the inverter 28 that is comprised of the DBC substrate 54 with the insulated gate bipolar transistors (IGBTs) 52 thereon and is integrated with the AC/DC bus to form one phase of the inverter circuit. In FIGS. 5 and 6 these elements are at different angular positions with respect to the compartment 50 then in FIG. 4 in order to illustrate an alternative arrangement. Also mounted on the base 90 is a circuit card 92 that is connected to a signal connector 94 for controlling the input and output current of the inverter 28. The inverter 28 is connected to a DC power source such as the batteries 26 or 26', or the generator 24, of FIG. 1 or 2 by a pair of direct current terminals 95 and 96. The annular reservoir portion 74 of the module 30, which includes the channels 78 for the second coolant 77, extends from a mounting ring 97 to which a cover 98 is bolted by bolts 100 that are received in relieved portions 102 of the cover and threaded into lugs 104 on the mounting ring 97. The inlet 80 and outlet 82 supplying the second coolant 77 to the channels 78 is connected through the outer wall of the reservoir portion 74 to the channels.

Openings, such as openings 83, in the mounting ring 96 allow coolant 64 that is pooled on the base 90 to flow into the annular reservoir 74 where it is cooled by the gas engine or fuel cell coolant 77 which has passed through the radiator 34 or 34'. The coolant pump 76 returns the liquid coolant 64 filtered by the filter 75 to the nozzles 62 via the inlet line 87. The filter 75 and the pump 76 are disposed within a housing portion 107 that also includes the sump 86. By having the cover 98 mounted with bolts 100 to the mounting ring 96 to form the compartment 50, the circuit card 92 and inverter 28 are accessible for maintenance if required. The compartment 50 and the reservoir 74 cooperate to define a housing 108 in which the compartment extends laterally from the axis 110 of the motor 16, and in which the reservoir is an annular space that is coaxial with the motor.

Figure 7:
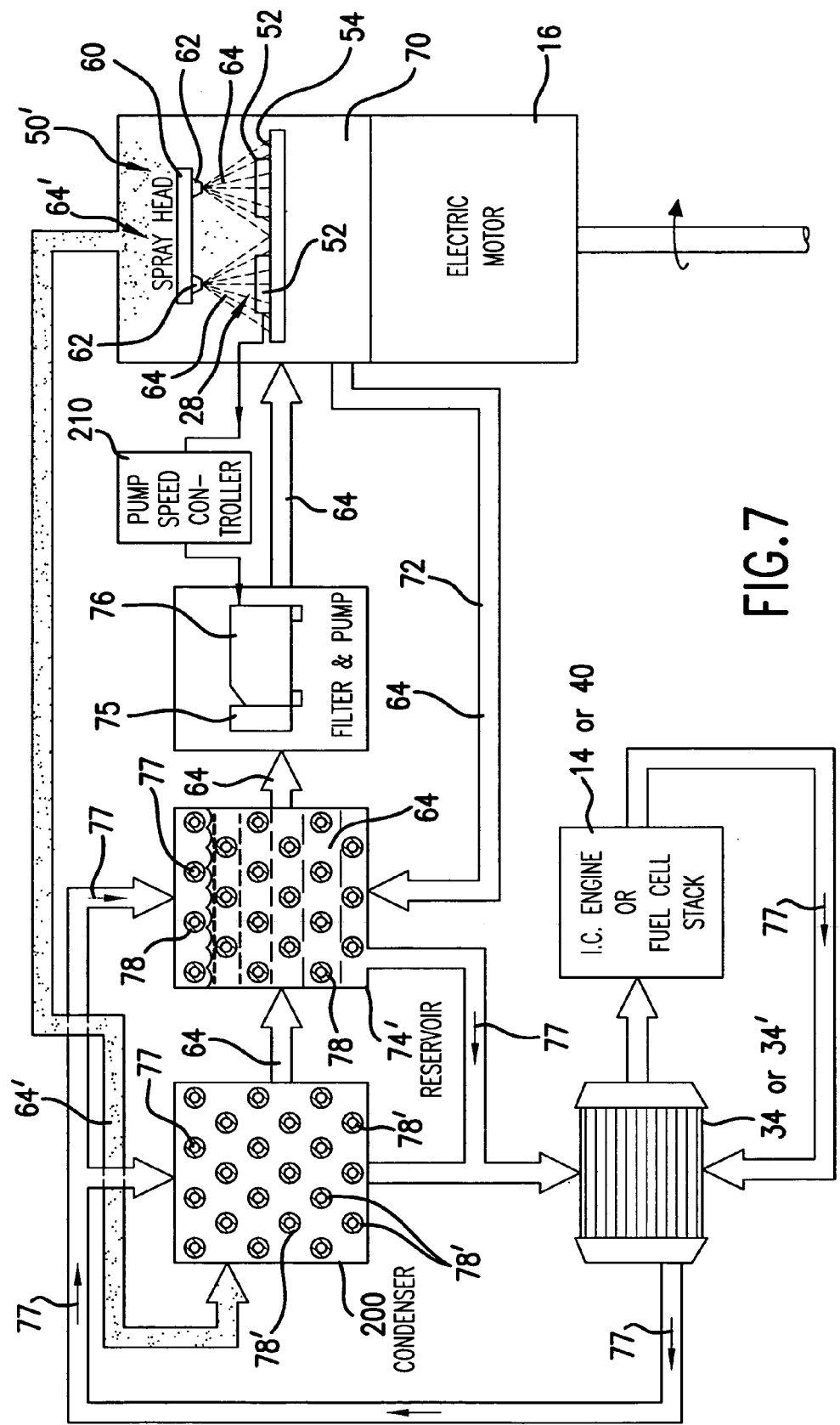
FIG. 7 is a schematic diagram of a spray cooled coolant loop utilized with the vehicles of FIGS. 1 and 2, but configured in accordance with a second embodiment of the invention.
Figure 8:
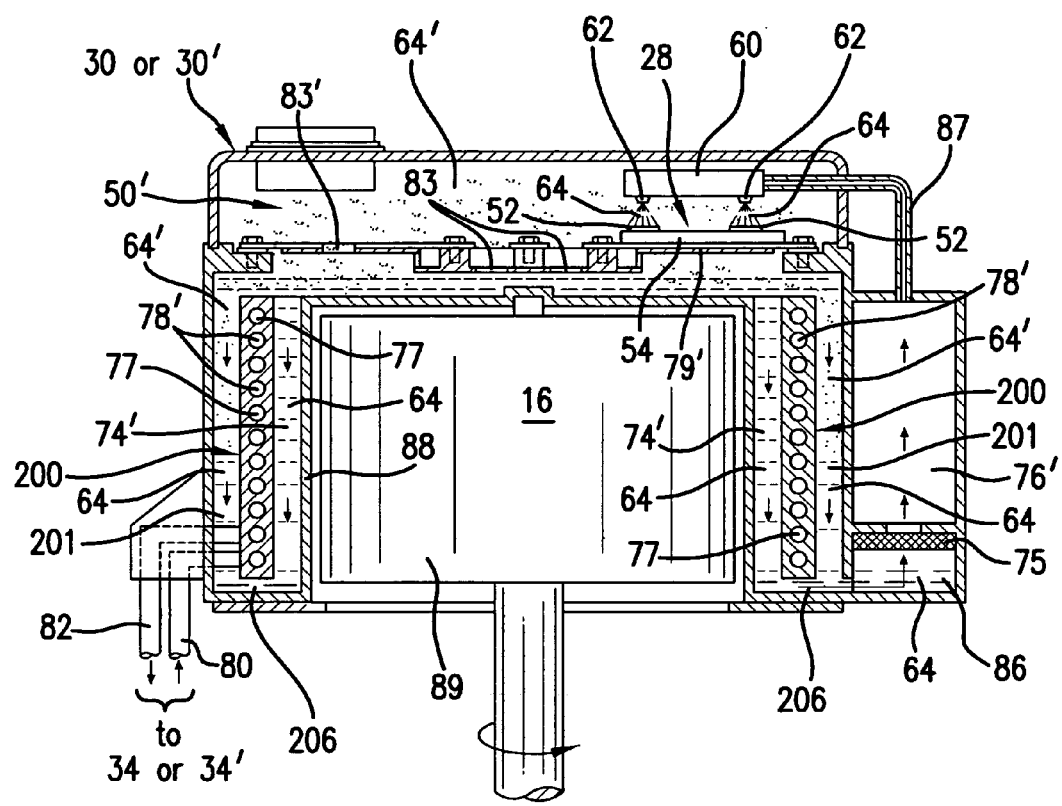
FIG. 8 is a cross section of a spray cooled integrated motor-inverter configured in accordance with the second embodiment of the present invention shown in FIG. 7.
Figure 9:
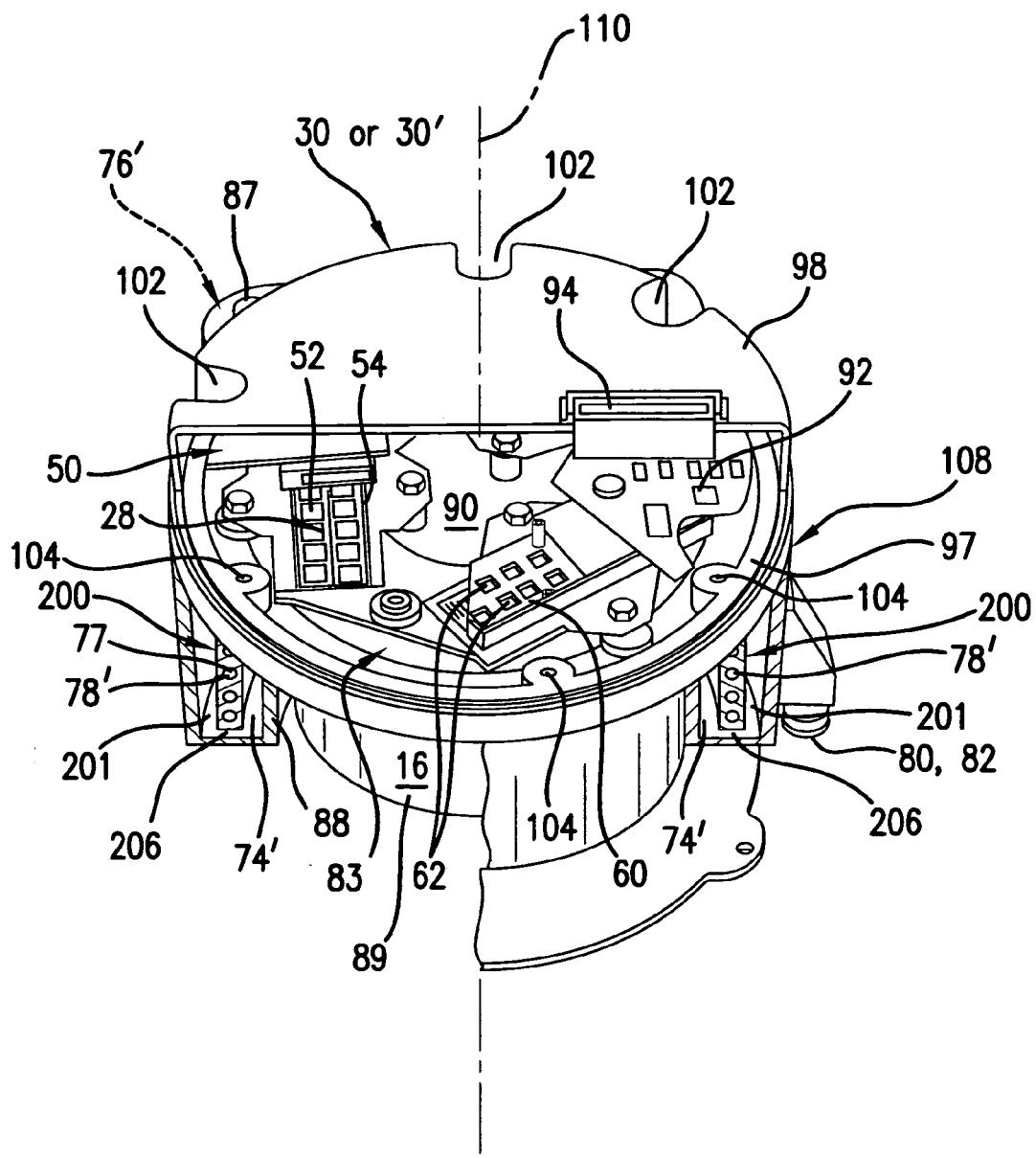
FIG. 9 is a perspective view, partially in elevation, of an integrated spray cooled motor-inverter configured similar to FIG. 8.

Referring now to FIGS. 7–9 where a second embodiment of the invention is shown, in FIGS. 7–9 similar reference numerals identify similar structure shown in FIGS. 3–6. The cooling arrangement described in the second embodiment of the invention takes advantage of the latent heat of vaporization of coolant 64. When coolant 64 is sprayed onto components that are hotter than the vapor temperature of the coolant, the coolant changes state or phase from a liquid to a vapor 64'. The vapor 64' carries the waste heat away from the inverter 28 as the vapor disperses into the chamber 50'. In the embodiment of FIGS. 7–9, the coolant loop 30 or 30' includes a condenser 200 which is separate from the reservoir 74', as well as a separate line 206 for conveying vaporized coolant 64' from the compartment 50' to the condenser 200. As with the first embodiment of FIG. 3, a second coolant 77 from the vehicle radiator 34 or 34' is circulated through the coolant pipes 78' to change the phase of the coolant 64' from a vapor back to a liquid. The liquid 64 from the condenser mixes with the liquid in the reservoir 74' and is filtered by a filter 75 prior to being pumped by the pump 76 back to the fluid dispenser 60, where the coolant 64 is sprayed in liquid form onto the power inverter 28.

In the embodiment of FIGS. 7–9, the pump 76' is preferably a variable output pump which is controlled by a controller 210 that is activated by an output current signal from the IGBTs 52 that increases the rate of pumping as the output power of the IGBTs increases. By providing variable spray cooling, temperature control under all operating conditions is achieved. This increases component reliability by minimizing temperature changes so that the inverter 28 operates under substantially isothermal conditions. By consistently controlling the amount of dielectric coolant 64 sprayed through the atomizer nozzles 62 so as to create a liquid mist, at maximum power dissipation conditions, constant flow of the liquid mist exhibits a phase change converting to a vapor 64' when sprayed on the inverter 28. When the phase change occurs, the power dispensing IGBTs 52 remain at substantially constant temperature regardless of increasing power dissipation. By varying the flow of the liquid coolant 64 relative to actual component power dissipation, the phase change region of the fluid comprising the liquid coolant 64 is utilized so that the coolant accommodates all operating conditions.

An example of a coolant utilized in the embodiment of FIGS. 7–9 is the aforementioned OS-120 available from Dow Corning Corporation of Midland, Mich.; OS-120 being a mixture of methylsiloxane and an organic compound.

OS-120 has a boiling point of about 98° C. and is a dielectric material that does not degrade when used to cool the interconnected electrical components. The dielectric liquid coolant 64 continues to absorb heat at 98° C. without changing phase to its vapor form 64' until the heat capacity of the coolant reaches its boiling point, at which time the liquid coolant vaporizes carrying away heat generated by the IGBTs 52 and by other components of the power electronics package.

Referring now to FIG. 8, the spray cooling arrangement of FIG. 7 is preferably utilized in the form of a module 30 or 30' as exemplified by FIG. 8. Vapor 64' is pulled by negative pressure of the pump 76' through openings 83' in base 79' and into the condenser 200, which is formed as an annular channel 201 having the pipes 78' located therein or adjacent thereto. The vaporized coolant 64' is condensed to the liquid coolant 64 on condenser 200 prior to passing into passageway 206. Any remaining vapor 64' mixes with the liquid coolant 64 in the reservoir 74' and all of the cooled and condensed coolant is sucked through the passageway 206 and into the sump 86 by the pump 76'. The liquefied and cooled coolant 64 then is recycled by the pump 76' from the sump 86 and sprayed in as a liquid mist 64 through the nozzles 62.

Referring now to FIG. 9, a perspective view illustrates a configuration of the modular unit 30 or 30' shown in FIG. 8, which modular unit is configured similarly to the first modular unit shown in FIGS. 5 and 6. A structural difference between the embodiment of FIG. 9 and that of FIGS. 5 and 6, is that in FIG. 9 the condenser 200 is included and includes an annular channel 201 which is coaxial with both the cooling reservoir 74' and electric motor 16 to provide a compact, modular motor-inverter having the spacial and convenience aspects of the modular unit illustrated in FIGS. 5 and 6. Preferably, in FIG. 9 the condenser 200 is disposed between the reservoir 74' which collects oversprayed liquid 64 and the annular channel 201 in which the vaporized coolant 64' is condensed. In other configurations the condenser may be disposed outboard of the annular channel 201 or may be positioned next to the inner wall 88 proximate the stator 89 of the motor 16. In still another arrangement separate channels 78 and 78' cool the liquid 64 and condense the vapor 64' within the module 30 or 30'. As with FIGS. 5 and 6 with respect to FIG. 4, the angular location of the inverter 28 with respect to the nozzles 62 in FIG. 9 differs from the location in FIG. 8, in order to illustrate an alternative arrangement.

From the foregoing description, one skilled in the art can easily ascertain the essential characteristics of this invention, and without departing from the spirit and scope thereof, can make various changes and modifications of the invention to adapt it to various usages and conditions.

We claim:

1. A cooling arrangement for cooling an inverter circuit having components packaged proximate an electric traction motor for driving at least one traction wheel of an automotive vehicle, the arrangement comprising:
    a housing disposed proximate the electric traction motor, the housing having a compartment with a space containing the components of the inverter circuit;
    a fresh coolant fluid inlet opening and a used coolant fluid outlet opening communicating with the space containing the components of the inverter circuit;
    a dielectric coolant fluid;
    a fluid dispenser for dispensing the dielectric coolant fluid into the space and onto the components of the inverter circuit;
    a reservoir for receiving the dielectric coolant fluid after the dielectric coolant fluid has absorbed heat from the components of the inverter circuit, the reservoir having a second cooling fluid flowing therethrough from the radiator of the automotive vehicle for transferring heat out of the dielectric cooling fluid, and
    a pump for cycling the dielectric coolant fluid while primarily in the liquid phase out of the reservoir and into the space for cyclically cooling the components of the inverter circuit.

2. The cooling arrangement of claim 1 wherein the dielectric cooling fluid is a dielectric cooling liquid and the reservoir is proximate the compartment and integral with the housing.

3. The cooling arrangement of claim 2 wherein the compartment is disposed at one end of the electric traction motor and extends laterally with respect to the axis of the traction motor and wherein the reservoir is disposed around the traction motor and extends coaxially with respect thereto.

4. The cooling arrangement of claim 3 further including a control for monitoring the cooling requirements of the components, the control being connected to the pump to power the pump in accordance with the cooling requirements of the components.

5. The cooling arrangement of claim 4 wherein the control monitors power output of the inverter circuit and adjusts operation of the pump according.

6. The cooling arrangement of claim 4 wherein the control monitors heat levels of the components of the inverter circuit and adjusts operation of the pump accordingly.

7. The cooling arrangement of claim 1 wherein the cooling arrangement is in combination with a cooling system for a fuel cell stack or a gas powered traction engine, with the second cooling fluid circulating through the radiator of the cooling system.

8. The cooling arrangement of claim 7 wherein the dielectric coolant fluid is a mixture of propylene glycol methyl ether and hexamethyldisiloxane.

9. The cooling arrangement of claim 1 wherein the dielectric coolant fluid is a mixture of propylene glycol methyl ether and hexamethyidisiloxane.

10. The cooling arrangement of claim 2 wherein the dielectric coolant liquid has a phase change point selected to absorb a substantial quantity of heat at the boiling temperature of the dielectric liquid coolant before the coolant becomes a vapor, and wherein the cooling arrangement further comprises condenser for converting the vapor back into coolant liquid before the coolant is recirculated by the pump.

11. The cooling arrangement of claim 10 wherein the condenser circulates cooling fluid from a radiator used to cool a drive source of the automotive vehicle to condense the dielectric coolant vapor.

12. The cooling arrangement of claim 11 wherein the condenser and reservoir are coaxial with one another, and with the electric traction motor, to form a modular unit.

13. The cooling arrangement of claim 12 wherein the dielectric coolant fluid is a mixture of propylene glycol methyl ether and hexamethyidisiloxane.

14. The cooling arrangement of claim 11 wherein the condenser is remote from the electric traction motor and the reservoir.

15. The cooling arrangement of claim 14 wherein the dielectric coolant fluid is a mixture of propylene glycol methyl ether and hexamethyldisiloxane.

16. A cooling arrangement for cooling an inverter circuit having components packaged proximate an electric traction motor for driving at least one tractor wheel of an automotive vehicle, the arrangement comprising:
- a housing disposed proximate the electric traction motor, the housing having a compartment with a space containing the components of the inverter circuit;
- a fresh coolant fluid inlet opening and a used coolant fluid outlet opening communicating with the space containing the components of the inverter circuit;
- a dielectric coolant liquid;
- a fluid dispenser for spraying the dielectric coolant liquid into the space and onto the components of the inverter circuit;
- a reservoir for collecting overspray of the dielectric fluid which has remained in the liquid phase after spraying,
- a condenser for liquefying dielectric coolant which has converted from the liquid phase to a vapor phase upon absorbing sufficient heat from the components of the inverter circuit to change phase; and
- a pump for cycling the dielectric coolant while primarily in the liquid phase from the reservoir and the condenser to the space for cycling cooling the components of the inverter circuit.

17. The cooling arrangement of claim 16 wherein the condenser is proximate the reservoir, the condenser and the reservoir both being cooled by a second coolant circulated through a radiator of the automotive vehicle to cool a power source for driving the automotive vehicle.

18. The cooling arrangement of claim 17 wherein the compartment is disposed at one end of the electric traction motor and extends laterally with respect thereto and wherein the condenser is disposed around the traction motor and extends coaxially with respect thereto.

19. The cooling arrangement of claim 18 further including a control for monitoring the cooling requirement of the components, the control being connected to the pump to power the pump in accordance with the cooling requirements of the components.

20. The cooling arrangement of claim 17 wherein the dielectric coolant fluid is a mixture of propylene glycol methyl ether and hexamethyidisiloxane.

21. The cooling arrangement of claim 16 wherein the dielectric coolant fluid is a mixture of propylene glycol methyl ether and hexamethyldisiloxane.

22. The cooling arrangement of claim 16 wherein the components of the inverter circuit comprise at least one insulated gate bipolar transistor.

* * * * *